United States Patent
Chadha

(10) Patent No.: US 12,405,629 B2
(45) Date of Patent: Sep. 2, 2025

(54) HIGH-SPEED SIGNALING SYSTEM WITH GROUND REFERENCED SIGNALING (GRS) OVER SUBSTRATE

(71) Applicant: NVIDIA Corporation, Santa Clara, CA (US)

(72) Inventor: Ish Chadha, San Jose, CA (US)

(73) Assignee: NVIDIA Corporation, Santa Clara, CA (US)

( * ) Notice: Subject to any disclaimer, the term of this patent is extended or adjusted under 35 U.S.C. 154(b) by 269 days.

(21) Appl. No.: 17/968,195

(22) Filed: Oct. 18, 2022

(65) Prior Publication Data
US 2023/0205254 A1 Jun. 29, 2023

Related U.S. Application Data

(60) Provisional application No. 63/294,008, filed on Dec. 27, 2021.

(51) Int. Cl.
| | |
|---|---|
| G06F 1/10 | (2006.01) |
| H04L 7/00 | (2006.01) |
| H04L 25/02 | (2006.01) |
| H05K 1/02 | (2006.01) |
| H05K 1/18 | (2006.01) |

(52) U.S. Cl.
CPC .............. *G06F 1/10* (2013.01); *H04L 7/0008* (2013.01); *H05K 1/181* (2013.01); *H04L 25/028* (2013.01); *H04L 25/0292* (2013.01); *H05K 1/0243* (2013.01)

(58) Field of Classification Search
CPC ..... G06F 1/10; H04L 25/028; H04L 25/0292; H04L 7/0008; H05K 1/0243; H05K 1/181
See application file for complete search history.

(56) References Cited

U.S. PATENT DOCUMENTS

| | | | | |
|---|---|---|---|---|
| 11,663,154 | B2 * | 5/2023 | Hor ..................... | G06F 13/1652 710/309 |
| 2014/0266416 | A1 * | 9/2014 | Dally ..................... | H05K 1/11 327/564 |
| 2020/0327088 | A1 * | 10/2020 | Choudhary ......... | G06F 13/4221 |

\* cited by examiner

*Primary Examiner* — Terrell S Johnson
(74) *Attorney, Agent, or Firm* — Lowenstein Sandler LLP

(57) ABSTRACT

A system includes a first coupled to a printed circuit board (PCB) and a second device coupled to the PCB. The system further includes a link coupled with the first device, the second device, and the PCB. The link includes a clock lane associated with transmitting a clock signal and one or more data lanes corresponding to the clock lane, where the link is configured to transmit ground referenced signaling (GRS).

20 Claims, 6 Drawing Sheets

HIGH-SPEED SIGNALING SYSTEM WITH GROUND REFERENCED SIGNALING (GRS) OVER SUBSTRATE

RELATED APPLICATIONS

This application claims the benefit of U.S. Provisional Patent Application No. 63/294,008, filed Dec. 27, 2021, which is incorporated by reference herein in its entirety.

TECHNICAL FIELD

At least one embodiment pertains to processing resources used to perform and facilitate high-speed communications. For example, at least one embodiment pertains to a high-speed signaling system with ground referenced signaling (GRS).

BACKGROUND

Communication systems transmit signals from a transmitter to a receiver via a communication channel or medium (e.g., cables, printed circuit boards, links, wirelessly, etc.) For example, the communication channel can communicate signals between chips—e.g., a chip to chip (C2C) system. The system can include a memory coherence protocol to ensure neither chip is accessing or operating with an out-of-date copy of data. Conventional communication systems can utilize software to manage the memory coherence protocol. Such conventional methods can increase overhead and reduce the performance of the communication system. Additionally, conventional communication systems can utilize encoded signaling when communicating C2C. Such conventional methods can increase power consumption and reduce bandwidth for the communication system.

BRIEF DESCRIPTION OF DRAWINGS

Various embodiments in accordance with the present disclosure will be described with reference to the drawings, in which.

DETAILED DESCRIPTION

Figure 1:
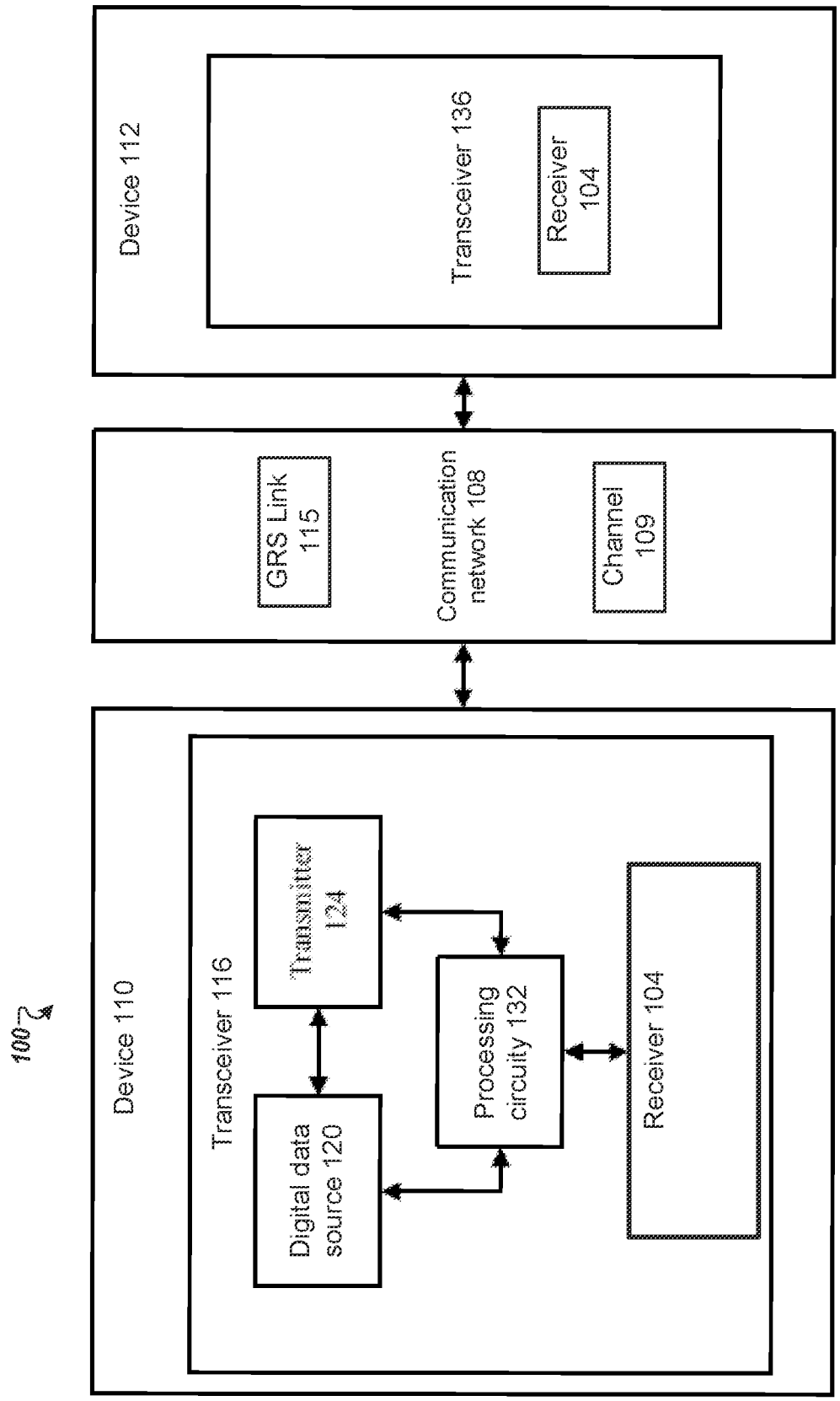
FIG. 1 is an example communication system employing ground referenced signaling (GRS), in accordance with at least some embodiments.

Communication systems transmit signals from a transmitter to a receiver via a communication channel or medium (e.g., cables, printed circuit boards, links, wirelessly, etc.). For example, a communication system may include a first device (e.g., a first integrated circuit (IC) or chip) and a second device (e.g., a second IC or chip) and communicate data via communication link—e.g., the communication system may be a chip-to-chip (C2C) interconnect with both devices including a transmitter and a receiver. The communication system can include hardware accelerators or graphic processing unit (GPU) and a central processing unit (CPU)—e.g., either the first device or second device can be examples of a CPU or GPU. The GPU can be an independent functional unit to perform parallel computational tasks assigned by the CPU. An operating system (OS) can manage the CPU but not manage or allocate memory that is local to the GPU—e.g., manage a physical memory available within the CPU but not the local cache at the GPU. In some communication systems, the OS can manage a memory coherence protocol to ensure the data accessed by the CPU and GPU is synchronized—i.e., ensure that if data is altered by the CPU, the GPU is notified and therefore does not access an out of date portion of data saved at a local cache. Having the OS (e.g., software) manage the memory coherence protocol can introduce additional latencies and limit the memory bandwidth of accelerator-based configurations—e.g., the performance of the communication system is reduced when the software manages the memory coherence protocol.

Additionally, high-speed communication systems can include noise—e.g., signals can suffer unwanted modifications during transmission over a high-speed link. For example, the high-speed communication system can utilize different currents to transmit different logic states, causing the noise in the system—e.g., simultaneous switching noise can occur when different currents are drawn for transmitting data. Because of the noise, high-speed communication systems can utilize differential signaling and encoding schemes. Differential signaling can double a number of balls on the chip package and double a number of traces used on a printed circuit board (PCB) coupling the GPU and CPU—e.g., consume additional resources on the PCB and reduce bandwidth. Utilizing additional balls on the chip package can limit a number of data lanes in the high-speed link to $2^N$ where "N" is the number of data lanes. Further, the high-speed communication system can utilize an encoding scheme (e.g., data bus inversion (DBI) or 128/130b) to further reduce the noise caused by using different currents. Encoding schemes can further reduce performance as encoding can utilize additional power and reduce bandwidth—e.g., bandwidth is lost by using encoding schemes.

Advantageously, aspects of the present disclosure can address the deficiencies above and other challenges by providing a ground referenced signaling (GRS) link between the first device and the second device—e.g., a GRS link coupling the CPU and GPU. For example, the GRS link can be ground referenced with an "N" number of data lanes associated with a forwarded clock. The GRS link can use similar (e.g., or same) current to transmit different logic states—e.g., use a positive voltage to transmit a first logic state, the positive voltage having a magnitude the same as or similar to a magnitude for a negative voltage used to transmit a second logic state. Because the current is similar and the GRS is ground referenced, noise in the communication system is reduced. Accordingly, the communication system can refrain from using differential signaling or an encoding scheme when communicating between the first device and the second device. By not using differential signaling, the communication system can reduce a number of traces and number of balls (e.g., pads, bumps, pins, sockets) on chip used. For example, an extra data lane can be added such that the communication system can include nine (9) data lanes in a same area conventional communication systems include eight (8) data lanes—e.g., the number of data lanes is not limited by the value $2^N$ where "N" is the number of data lanes. In addition to using less area on the PCB, the communication system can refrain from using an encoding scheme because the GRS link is ground referenced. By refraining from encoding data transmitted, the communication system can increase performance and bandwidth. In at least one embodiment, the GRS link can be used for a memory coherence protocol—e.g., hardware can manage the memory coherence protocol for the communication system. The communication system can reduce latencies and increase memory bandwidth because the memory coherence protocol is managed in hardware (e.g., via the GRS link). Accordingly, embodiments of the present application allow for an improved high-speed signaling system with the GRS link.

FIG. 1 illustrates an example communication system 100 according to at least one example embodiment. The system 100 includes a device 110, a communication network 108 including a communication channel 109, and a device 112. In at least one embodiment, devices 110 and 112 are two end-point devices in a computing system, such as a central processing unit (CPU) or graphics processing unit (GPU). In an embodiment, device 110 is a CPU, and device 112 is a GPU. In at least one embodiment, devices 110 and 112 are two servers. In at least one example embodiment, devices 110 and 112 correspond to one or more of a Personal Computer (PC), a laptop, a tablet, a smartphone, a server, a collection of servers, or the like. In some embodiments, the devices 110 and 112 may correspond to any appropriate type of device that communicates with other devices connected to a common type of communication network 108. According to embodiments, the receiver 104 of devices 110 or 112 may correspond to a GPU, a switch (e.g., a high-speed network switch), a network adapter, a CPU, a memory device, an input/output (I/O) device, other peripheral devices or components on a system-on-chip (SoC), or other devices and components at which a signal is received or measured, etc. As another specific but non-limiting example, the devices 110 and 112 may correspond to servers offering information resources, services, and/or applications to user devices, client devices, or other hosts in the system 100. In one example, devices 110 and 112 may correspond to network devices such as switches, network adapters, or data processing units (DPUs).

Examples of the communication network 108 that may be used to connect the devices 110 and 112 include an Internet Protocol (IP) network, an Ethernet network, an InfiniBand (IB) network, a Fibre Channel network, the Internet, a cellular communication network, a wireless communication network, combinations thereof (e.g., Fibre Channel over Ethernet), variants thereof, and/or the like. In one specific but non-limiting example, the communication network 108 is a network that enables data transmission between the devices 110 and 112 using data signals (e.g., digital, optical, wireless signals). In an embodiment, the communication network 108 can include or be an example of a ground referenced signaling (GRS) link 115. In an embodiment, the GRS link can transmit data in accordance with a memory coherence protocol between device 110 and device 112. In at least one embodiment, the GRS link 115 can refrain from using differential signaling and refrain from encoding data transmitted between device 110 and device 112. In some embodiments, the GRS link 115 can include an "N" number of data lanes and a forwarded clock in each direction between device 110 and device 112—e.g., an "N" number of data lanes and a first forwarded clock to transmit data from device 110 to device 112 and an "N" number of data lanes and a second forwarded clock to transmit data from device 112 to device 110. In such examples, the GRS link 115 can be bi-directional. In some embodiments, the "N" can be any number greater than one (1)—e.g., the "N" number of data lanes is not limited to a value $2^N$.

The device 110 includes a transceiver 116 for sending and receiving signals, for example, data signals. The data signals may be digital or optical signals modulated with data or other suitable signals for carrying data.

The transceiver 116 may include a digital data source 120, a transmitter 124, a receiver 104, and processing circuitry 132 that controls the transceiver 116. The digital data source 120 may include suitable hardware and/or software for outputting data in a digital format (e.g., in binary code and/or thermometer code). The digital data output by the digital data source 120 may be retrieved from memory (not illustrated) or generated according to input (e.g., user input).

The transmitter 124 includes suitable software and/or hardware for receiving digital data from the digital data source 120 and outputting data signals according to the digital data for transmission over the communication network 108 to a receiver 104 of device 112. Additional details of the structure of the transmitter 124 are discussed in more detail below with reference to the figures.

The receiver 104 of devices 110 and 112 may include suitable hardware and/or software for receiving signals, such as data signals from the communication network 108. For example, the receiver 104 may include components for receiving processing signals to extract the data for storing in a memory, as described in detail below with respect to FIG. 2-FIG. 5.

The processing circuitry 132 may comprise software, hardware, or a combination thereof. For example, the processing circuitry 132 may include a memory including executable instructions and a processor (e.g., a microprocessor) that executes the instructions on the memory. The memory may correspond to any suitable type of memory device or collection of memory devices configured to store instructions. Non-limiting examples of suitable memory devices that may be used include Flash memory, Random Access Memory (RAM), Read Only Memory (ROM), variants thereof, combinations thereof, or the like. In some embodiments, the memory and processor may be integrated into a common device (e.g., a microprocessor may include integrated memory). Additionally or alternatively, the processing circuitry 132 may comprise hardware, such as an application-specific integrated circuit (ASIC). Other non-limiting examples of the processing circuitry 132 include an Integrated Circuit (IC) chip, a Central Processing Unit (CPU), a General Processing Unit (GPU), a microprocessor, a Field Programmable Gate Array (FPGA), a collection of logic gates or transistors, resistors, capacitors, inductors, diodes, or the like. Some or all of the processing circuitry 132 may be provided on a Printed Circuit Board (PCB) or collection of PCBs. It should be appreciated that any appropriate type of electrical component or collection of electrical components may be suitable for inclusion in the processing circuitry 132. The processing circuitry 132 may send and/or receive signals to and/or from other elements of the transceiver 116 to control the overall operation of the transceiver 116.

The transceiver 116 or selected elements of the transceiver 116 may take the form of a pluggable card or controller for the device 110. For example, the transceiver 116 or selected elements of the transceiver 116 may be implemented on a network interface card (NIC).

The device 112 may include a transceiver 136 for sending and receiving signals, for example, data signals over a channel 109 of the communication network 108. The same or similar structure of the transceiver 116 may be applied to transceiver 136, and thus, the structure of transceiver 136 is not described separately.

Although not explicitly shown, it should be appreciated that devices 110 and 112 and the transceivers 116 and 136 may include other processing devices, storage devices, and/or communication interfaces generally associated with computing tasks, such as sending and receiving data.

Figure 2:
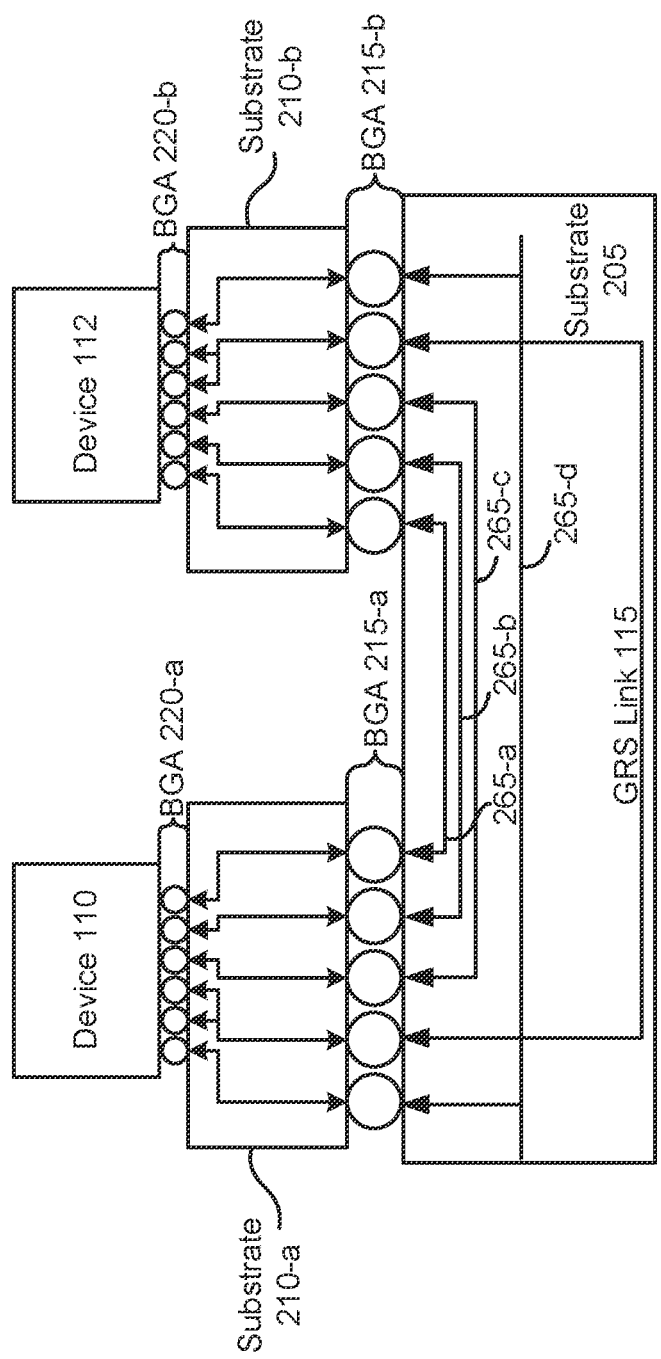
FIG. 2 illustrates an example communication system employing a GRS link, in accordance with at least some embodiments.

FIG. 2 illustrates an example communication system 200 according to at least one example embodiment. In some embodiments, communication system 200 may be an example of communication system 100. The system 200 includes a device 110 and a device 112 as described with reference to FIG. 1. The device 110 and device 112 can be coupled by a GRS link 115. In some embodiments, the communication system 200 can include substrate 205 and substrates 210. In some embodiments, the communication system 200 can include BGA 215 and BGA 220. In at least one embodiment, the communication system 200 can include conductive lines 265 that couple substrate 210-a and substrate 210-b. In an embodiment, substrate 205 and GRS link 115 can be an example of the communication network 108.

In at least one embodiment, device 110 (e.g., a first device) or device 112 (e.g., a second device) can be a central processing unit (CPU) or graphics processing unit (GPU). In one embodiment, device 110 can be a CPU, and device 112 can be a GPU. In some embodiments, device 110 is configured to execute instructions received from an operating system (OS) or software stack—e.g., arithmetic, controlling, or input/output (I/O) operations. In an embodiment, device 110 is configured to delegate tasks to device 112. In such embodiments, device 112 is configured to execute, in parallel, the delegated tasks. In an embodiment, the operating system can manage the physical memory of device 110. In at least one embodiment, the operating system can refrain from managing or allocating local memory of device 112.

In an embodiment, the GRS link 115 can be a signaling scheme that is ground referenced used for serial data transfer between devices 110 and 112—e.g., the GRS link 115 is configured to transmit data from the first device to the second device. In an embodiment, the GRS link 115 can have an "N" number of data lanes associated with a forwarded clock lane in each direction—e.g., from device 110 to device 112 and from device 112 to device 110. In some embodiments, "N" can be any number greater than one (1) as described with reference to FIGS. 3 and 5. That is, the GRS link 115 can include a clock lane associated with transmitting a clock signal and one or more data lanes corresponding to the clock lane, where the GRS link 115 is configured to transmit ground referenced signaling. In some embodiments, the GRS link 115 can utilize a positive voltage to transmit a first logic state and a negative voltage to transmit a second logic state. For example, the GRS link 115 can transmit a logic state '1' using a positive voltage and transmit a logic state '0' using a negative voltage. In some embodiments, the first voltage and the second voltage can have a same magnitude. In such embodiments, the GRS link 115 can utilize similar (or the same) current to transmit either the first logic state or the second logic state. For example, the GRS link 115 can utilize an internal capacitor. In such examples, the GRS link 115 can charge the internal capacitor to produce the negative voltage and discharge the internal capacitor to produce the positive voltage. In some embodiments, charging and discharging the internal capacitor can utilize the same amount of current—e.g., a similar amount of current can be used to charge or discharge the internal capacitor. In some embodiments, the GRS link 115 can refrain from using differential signals or encoding schemes. Accordingly, the GRS link 115 can increase bandwidth. In at least one embodiment, the GRS link 115 can be a high-speed link (e.g., transferring 40 gigabits per second (GBPS)). In at least one embodiment, the GRS link 115 can include RC-dominated channels and LC transmission lines. In an embodiment, GRS link 115 can be configured to transmit data according to a memory coherence protocol between device 110 and device 112—e.g., transmit data according to a memory coherence protocol associated with transmitting data from the first device to the second device. Accordingly, device 110 or device 112 can be aware of data modifications made by the other device and update (e.g., rewrite) data in a local cache to reflect the modifications indicated by the GRS link 115.

Substrate 205 can be configured to couple the device 110 and device 112. In some embodiments, substrate 205 can be coupled to a substrate 210-a and a substrate 210-b via a ball grid array (BGA) 215-a and BGA 215-b. In some embodiments, the substrate 205 can be an example of a printed circuit board (PCB). In some embodiments, the substrate 205 can include conductive paths (e.g., conductive lines or traces) to communicate signals between the device 110 and device 112. In some embodiments, each conductive line 265 of substrate 205 can be coupled with a ball of the BGA 215-a and a ball of the BGA 215-b. In at least one embodiment, the substrate 205 can include the GRS link 115—e.g., data paths of the GRS link 115 can be conductive paths or traces on the substrate 205 (e.g., traces of the PCB). For example, each data lane of the one or more data lanes of the GRS link can be associated with a single trace of the substrate 205 (e.g., PCB). It should be noted that four conductive lines 265 are illustrated by way of example, and communication system 200 can include more than or less than four (4) conductive lines 265.

In an embodiment, substrate 210-a can be configured to couple device 110 to substrate 205 via BGA 220-a, and substrate 210-b can be configured to couple device 112 to substrate 205 via BGA 220-b. In an embodiment, substrates 210 can be examples of an organic substrate or package. For example, substrates 210 can be based on FR-4 (e.g., glass fiber or epoxy composite) or polyimide. In some embodiments, substrates 210 can be examples of inorganic substrates. In some embodiments, substrates 210 can include conductive lines carrying signals from BGA 215 to BGA 220—e.g., substrate 210-a can include conductive lines to carry signals from BGA 215-a to BGA 220-a.

Although not explicitly shown, it should be appreciated that device 110, device 112, substrate 205, and substrates 210 can include other processing devices, storage devices, and/or communication interfaces generally associated with computing tasks, such as sending and receiving data. In some embodiments, GRS link 115, device 110, device 112, substrate 205, and substrates 210 can include additional processing devices associated with communicating data according to a memory coherence protocol.

Figure 3:
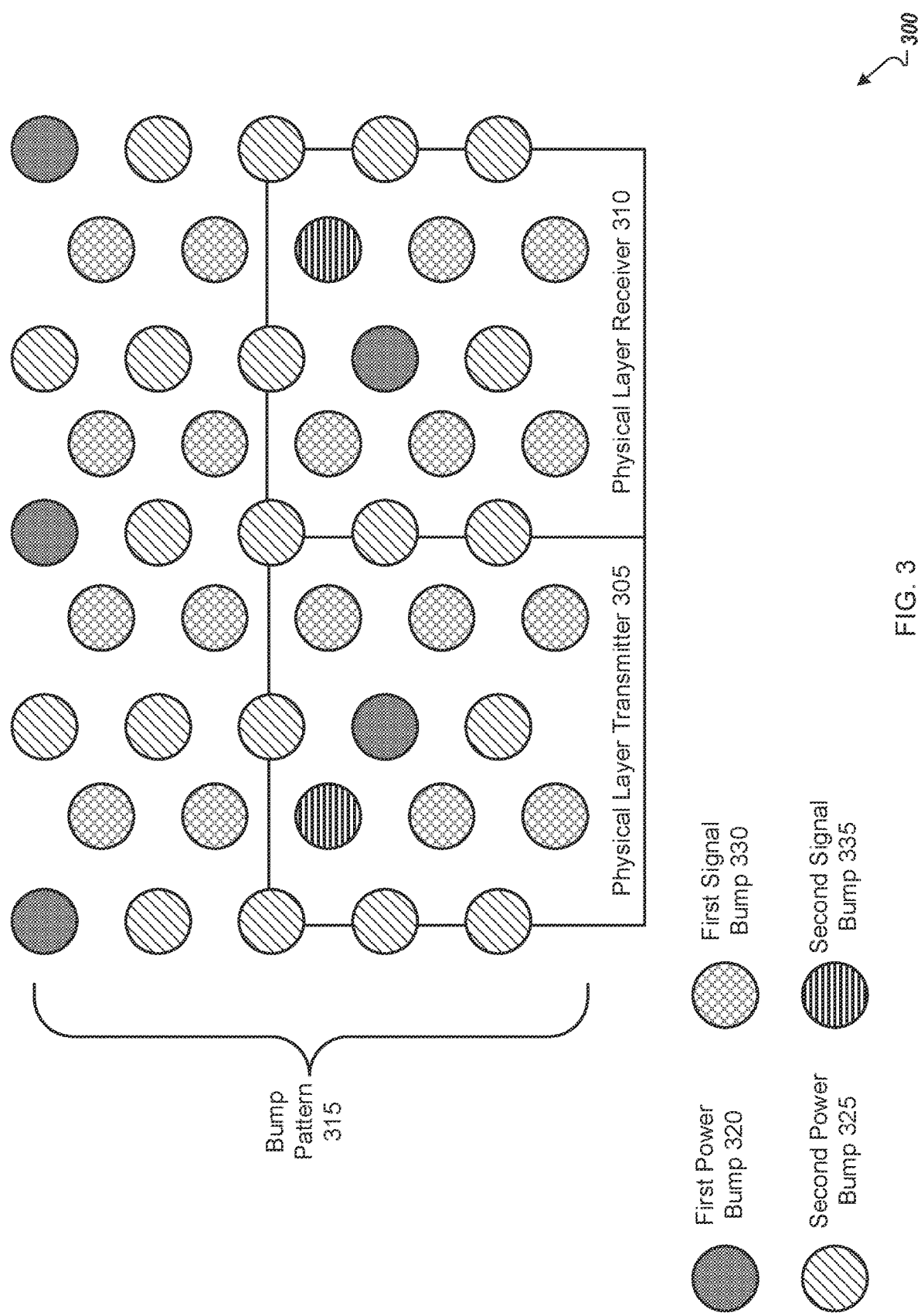
FIG. 3 illustrates an example communication system with a bump pattern, in accordance with at least some embodiments.

FIG. 3 illustrates an example communication system 300 utilizing a bump pattern 315. In at least one embodiment, communication system 300 is an example of communication system 100 or 200 as described with reference to FIGS. 1 and 2. The communication system 300 can include a physical layer transmitter 305 and a physical layer receiver 310. In an embodiment, physical layer transmitter 305 can be included in device 110 or device 112, and physical layer receiver 310 can be included in device 110 or device 112. In some embodiments, physical layer transmitter 305 can be included in device 110, and physical layer receiver 310 can be included in device 112. In at least one embodiment, communication system 300 can include a bump pattern 315.

In an embodiment, physical layer transmitter 305 can be configured to transmit data across a link—e.g., across a GRS link 115 as described with reference to FIG. 2. In an embodiment, physical layer receiver 310 can be configured to receive data across the GRS link 115. In an embodiment, physical layer transmitter 305 and physical layer receiver 310 can include input/output (I/O) buffers, parallel-to-serial and serial-to-parallel converters, impedance matching circuitry, logic circuitry, etc., to transmit and receive data and signals across the GRS link 115. That is, the GRS link 115 is a layered architecture with independent physical, data link, and transaction layers. For example, the GRS link 115 can include a transaction layer to request a transaction—e.g., transmission of data. In such examples, the transaction layer can generate transaction layer packets (TLP) that are transmitted to the data link layer and complete transactions by disassembling packets received from other components of a receiver (e.g., receiver 104 as described with reference to FIG. 1) of device 110 and device 112. The GRS link 115 can also include the data link layer to ensure data is being sent across the GRS link correctly and without errors. Although shown next to each other, the physical layer transmitter 305 and physical layer receiver 310 can have a further physical distance—e.g., physical layer transmitter 305 can be included in device 110, and physical layer receiver 310 can be included in device 112, which are not physically next to each other as illustrated in FIG. 2.

In an embodiment, bump pattern 315 can include bumps or interposers that connect device 110 or device 112 to the substrates 210—e.g., connect the device 110 or device 112 to the BGA 220-a or BGA 220-b as described with reference to FIG. 2, respectively. In some embodiments, the bump pattern 315 can be an example of a flip chip or controlled collapse chip connection (C4). In an embodiment, bump pattern 315 can include columns of signal bumps and power bumps. For example, the bump pattern 315 can include a first power bump 320 and a second power bump 325. In some embodiments, the first power bump 320 can represent a bump that does not receive power. In some embodiments, the second power bump 325 can represent a bump that receives power. In at least one embodiment, the bump pattern can include a first signal bump 330 and a second signal bump 335. In at least one embodiment, the first signal bump 330 can be configured to transmit or receive data signals or control signals. In some embodiments, the second signal bump 335 can be configured to transmit or receive clock signals—e.g., a forwarded clock transmitted from physical layer transmitter 305 to physical layer receiver 310 as described with reference to FIG. 5. In some embodiments, the clock signal can be a single-phase clock signal or a multi-phase clock signal. In at least one embodiment, the GRS link 115 can refrain from using differential signaling—e.g., the GRS link 115 can refrain from transmitting complementary signals along with the data signals. Accordingly, the GRS link 115 can reduce the number of balls used in the BGA 220 and the number of conductive lines (e.g., conductive lines 265 as described with reference to FIG. 2) used on a printed circuit board (PCB)—e.g., on substrate 205 as described with reference to FIG. 2. Accordingly, the GRS link 115 can more effectively utilize an area covered by the bump pattern 315—e.g., a silicon area including the bump pattern 315. That is, an area utilized by the GRS link 115 is associated with the bump pattern 315—e.g., each data lane of the GRS link 115 is coupled with a bump of the bump pattern 315. As no bumps of the bump pattern 315 are utilized for differential signaling, additional GRS data lanes can be added. For example, a circuit area for a GRS link 115 with nine (9) data lanes is less than an area of the bump pattern 315. In such examples, the GRS link 115 can include nine (9) data lanes when coupled with the bump pattern 315 compared with eight (8) data lanes a conventional system can include in the same area—e.g., the GRS link 115 can have a higher bandwidth in a given silicon area compared with conventional solutions. Accordingly, the GRS link 115 can have an "N" number of data lanes, where "N" is greater than one (1) and can be odd or even—e.g., the number of data lanes is not limited to a value of $2^N$.

Figure 4:
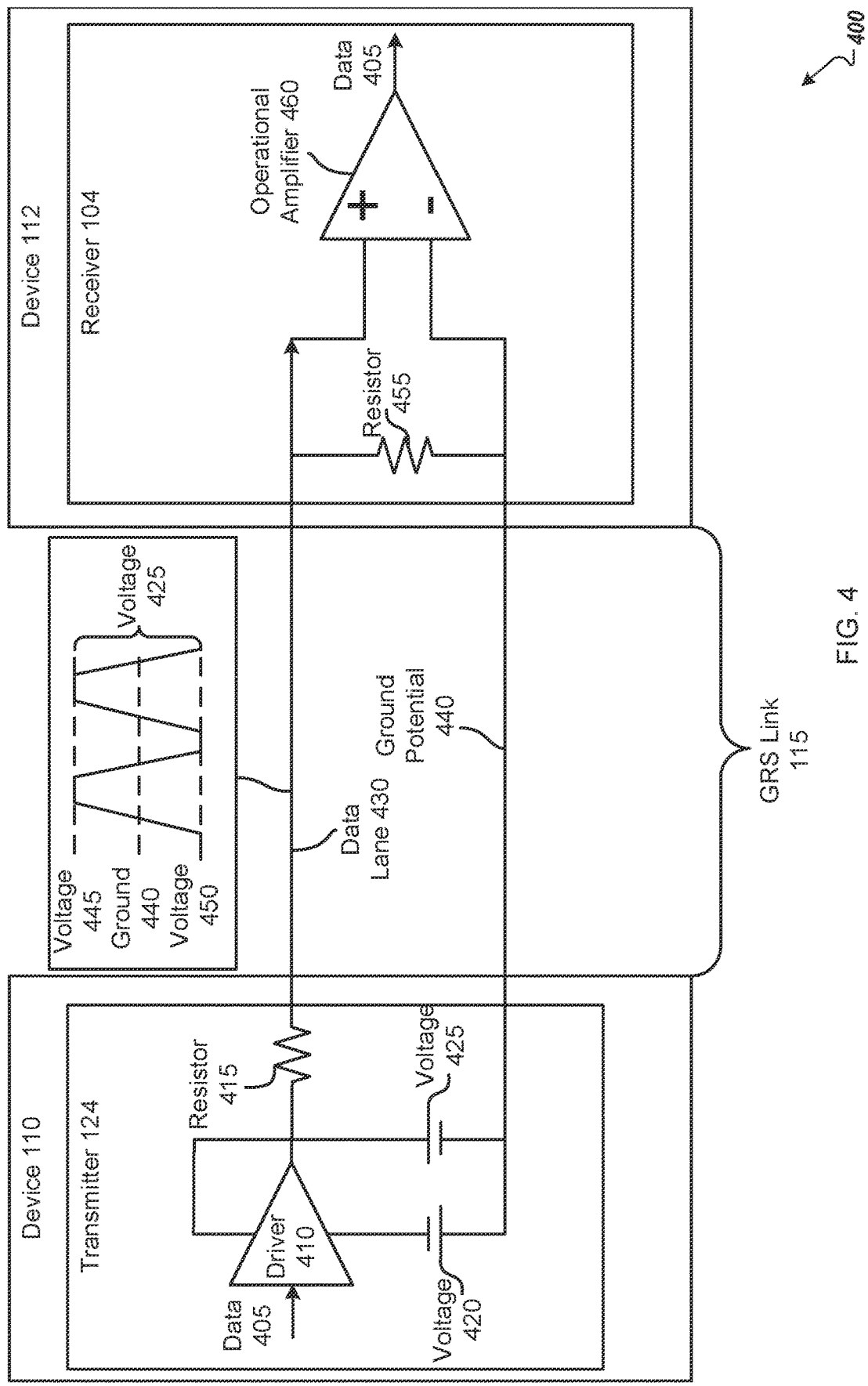
FIG. 4 illustrates an example communication over a GRS link, in accordance with at least some embodiments.

FIG. 4 illustrates an example communication system 400 communicating data 405 over a GRS link 115 in accordance with at least one embodiment. In at least one embodiment, communication system 400 is an example of communication system 100 and 200 as described with reference to FIGS. 1 and 2. The communication system 400 includes a device 110 and a device 112 as described with reference to FIG. 1. The device 110 and device 112 can be coupled to a GRS link 115 as described with reference to FIG. 2. In an embodiment, device 110 can include a transmitter 124 that includes a driver 410, resistor 415, voltage 420, and a voltage 425. In some embodiments, device 112 can include a receiver 104 that includes a resistor 455 and an operational amplifier 460 (e.g., Op-Amp 460). In at least one embodiment, device 110 can also include receiver 104, and device 112 can include transmitter 124—e.g., communications between device 110 and 112 can be bi-directional. In an embodiment, GRS link 115 can be coupled with a ground potential 440—e.g., be ground referenced. In at least one example, device 110 is a CPU, and device 112 is a GPU.

In an embodiment, driver 410 can be configured to receive data 405 and drive data 405 on the data lane 430. In some embodiments, driver 410 can be configured to drive data 405 utilizing a voltage 420 or a voltage 425. In at least one embodiment, voltage 420 can be a negative voltage, and voltage 425 can be a positive voltage. In some embodiments, voltage 420 and voltage 425 can have a same magnitude—e.g., voltage 420 and voltage 425 can be symmetrical with respect to a ground potential 440. In at least one embodiment, the driver 410 can be configured to use voltage 420 or voltage 425 based on a logic state of data 405 transmitted. For example, voltage 420 (e.g., the negative voltage) can be associated with a logic value '0' (e.g., a first logic state), and voltage 425 (e.g., the positive voltage) can be associated with a logic value '1' (e.g., a second logic value). In such examples, the driver 410 can use the voltage 420 to transmit the logic value '0' and use the voltage 425 to transmit the logic value '1'—e.g., the GRS link 115 is configured to transmit the first logic state at a first voltage (e.g., voltage 450) and the second logic state at a second voltage (e.g., voltage 445). In at least one embodiment, voltage 420 and voltage 425 can be voltage sources. In some embodiments, voltage 420 and voltage 425 can be generated (e.g., supplied) by an internal capacitor of the transmitter 124 or GRS link 115.

In at least one embodiment, data lane 430 is configured to transmit (e.g., carry or route) data 405 from device 110 to device 112. For example, after data 405 is driven by driver 410 and passes through resistor 415, the data lane 430 can transmit the data 405 from device 110 to device 112. In some embodiments, the data lane 430 can transmit a voltage 445 or voltage 450. In some examples, the voltage 445 can be half of voltage 425 and correspond to the logic value '1', and the voltage 450 can be half of voltage 420 and correspond to the logic value '0.' In some embodiments, voltage 445 and voltage 450 can be symmetrical with respect to the ground potential 440—e.g., the difference between voltage 445 and voltage 450 can be voltage 425.

In at least one embodiment, the GRS link 115 can be configured to transmit data 405 using ground referenced signaling—e.g., ground potential 440. In such embodiments, the ground voltage 440 is the signal reference voltage. In some embodiments, the ground potential 440 can have the lowest impedance supply network in the communication system 400 and cause a mismatch between the reference voltage (e.g., the ground potential 440) of the transmitter 124 and receiver 104 to be. In some embodiments, for the GRS link 115, the ground potential 440 can be a signal return network, which ensures high-quality termination at both device 110 and device 112. In an embodiment, the transmitter 124 can be a bi-directional current source as voltage 445 and voltage 450 are symmetrical above and below the ground potential 440. In some embodiments, to transmit voltage 445 or voltage 450, the GRS link 115 can have a pre-charge phase where an internal capacitor is charged, and a drive phase where charge stored on the internal capacitor is driven on the data lane 430 by connecting the internal capacitor terminals between the data lane 430 and the ground potential 440. In such embodiments, a polarity of the connection drives either a negative or positive current onto the data lane 430—e.g., either the logic value '0' or logic value '1.' In some embodiments, because the internal capacitor is charged to a same voltage regardless of logic state, a near constant current supply is generated—e.g., a same or similar current is used to transmit the logic value '0' and logic value '1.' For example, the GRS link 115 can transmit the first logic state at a first current and the second logic state at a second current, where the first current is the same as (or similar to) the second current. Accordingly, noise in the system is reduced.

In an embodiment, receiver 104 is configured to receive data 405 and determine a logic state for data 405. For example, the receiver 104 can include an operational amplifier 460 coupled with a resistor 455, the data lane 430, and the ground potential 440. In some embodiments, the operational amplifier 460 can output data 405 based on whether voltage 445 or voltage 450 is received—e.g., determine a logic state '1' when voltage 445 and the ground potential 440 are compared and determine a logic state '0' when voltage 450 and the ground potential 440 are compared.

In an embodiment, because ground potential 440 is used as a reference and the current supply is nearly constant, the GRS link 115 can refrain from encoding data 405 transmitted from device 110 to device 112. In such embodiments, the GRS link 115 can increase bandwidth—e.g., GRS link 115 can refrain from consuming additional power and bandwidth to encode data 405. In some embodiments, using the GRS link 115 can increase the performance of the communication system 400 as data 405 is transmitted at the higher bandwidth.

Figure 5:
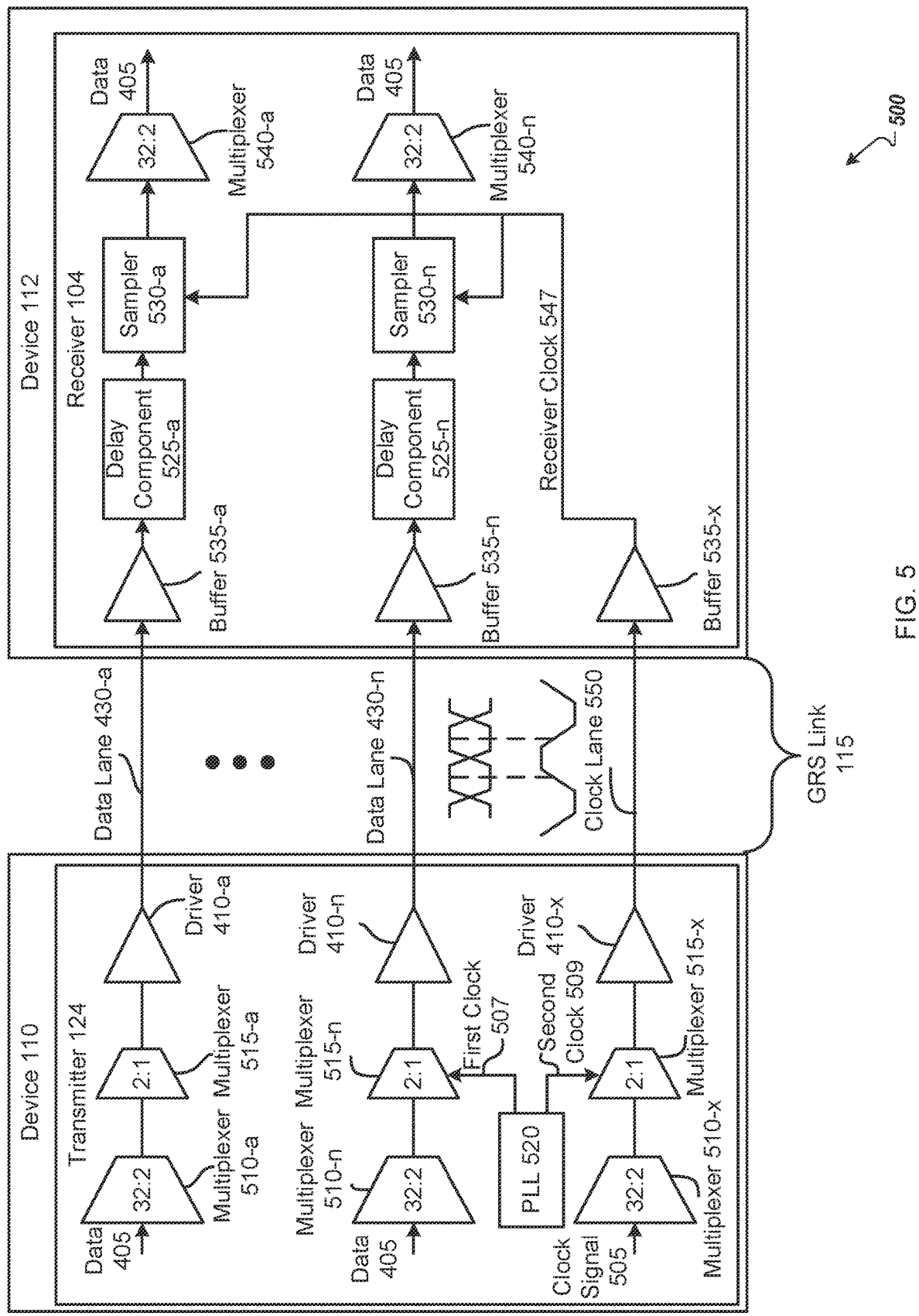
FIG. 5 is an example communication system employing a GRS link, in accordance with at least some embodiments.

FIG. 5 illustrates an example communication system 500 communicating data 405 over a GRS link 115 in accordance with at least one embodiment. In at least one embodiment, communication system 500 is an example of communication systems 100, 200, 300, and 400 as described with reference to FIGS. 1-4. The communication system 500 includes a device 110 and a device 112 as described with reference to FIG. 1. The device 110 and device 112 can be coupled to a GRS link 115 as described with reference to FIG. 2. In an embodiment, device 110 can include a transmitter 124 that includes drivers 410 (e.g., as described with reference to FIG. 4), multiplexers 510, multiplexers 515, a phase-locked loop (PLL) 520. In some embodiments, device 112 can include a receiver 104 that includes buffers 535, delay components 525, samplers 530, and multiplexers 540. In at least one embodiment, device 110 can also include receiver 104, and device 112 can include transmitter 124—e.g., communications between device 110 and 112 can be bi-directional. In an embodiment, GRS link 115 includes an "N" number of data lanes 430 and a clock lane 550 associated with data lanes 430. In some embodiments, the GRS link 115 can also include a second set of "N" number of data lanes from device 112 to device 110 and a second clock lane associated with the second set of data lanes. That is, the GRS link 115 can include the clock lane 550 (e.g., first clock lane) associated with transmitting clock signal 505 (e.g., a first clock signal) from device 110 (e.g., first device) to device 112 (e.g., a second device) and data lanes 430 (e.g., a first set of data lanes) corresponding to the clock lane 550 to transmit data from the device 110 to device 112. In such examples, the GRS link 115 can include a second clock lane associated with transmitting a second clock signal from the second device to the first device and a second set of data lanes corresponding to the second clock lane to transmit data from the second device to the first device. In some embodiments, a number of data lanes 430 (e.g., a first number) is equal to a second number of data lanes in the second set of data lanes. In some embodiments, the first and second numbers can be odd or even.

As described with reference to FIGS. 2 and 3, the GRS link 115 can include an "N" number of data lanes 430 associated with a forwarded clock lane 550. In some embodiments, the GRS link 115 can include one or more data lanes 430—e.g., the "N" number of data lanes 430 is greater than or equal to one (1). For example, the GRS link 115 can include nine (9) data lanes 430. Each data lane 430 can be coupled with at least a multiplexer 510, a multiplexer 515, and a driver 410 at the transmitter 124—e.g., data lane 430-a can be coupled with multiplexer 510-a, multiplexer-515-a, and driver 410. In some embodiments, multiplexer 510 and multiplexer 515 are configured to serialize data 405 received. For example, the device 110 can store data 405 in parallel. In such examples, multiplexer 510 and multiplexer 515 can serialize data 405 to transmit data 405 across the data lane 430-a. For example, data 405 can include 32 parallel bits, and the multiplexer 510 can convert the 32 parallel bits into two (2) parallel bits, and multiplexer 515 can convert the two (2) parallel bits into a single (e.g., one (1)) serial bit. In an embodiment, the multiplexer 510 and multiplexer 515 can serialize a "B" number of parallel bits in a given clock cycle of the transmitter 124—e.g., serialize 32 bits. In some embodiments, multiplexer 510 and multiplexer 515 can serialize different data amounts (e.g., 64:4, 16:1, 8:1, etc.) based on an amount of bits stored in parallel for the device 110. In at least one embodiment, the transmitter 124 can include additional multiplexers to serialize additional data 405. In some embodiments, the multiplexer 510 and multiplexer 515 can serialize the data 405 at a first clock 507. In at least one embodiment, the first clock 507 is faster than the transmitter clock. For example, the transmitter clock can have a period of "T," and the first clock can have a period of 2T/B, where "B" is the number of bits transmitted in a single clock cycle—e.g., "B" is the burst length. In an embodiment, the first clock 507 (e.g., a high-speed or high-frequency clock) can be generated by PLL 520. In at least one embodiment, the GRS link 115 can also transmit data in accordance with a memory coherence protocol. In some embodiments, the GRS link 115 can include hardware to manage the memory coherence protocol for the communication system.

In some embodiments, the GRS link 115 can transmit a forwarded clock (e.g., clock signal 505) from device 110 to device 112 via the clock lane 550. For example, the clock lane 550 can be coupled with multiplexer 510-$x$, multiplexer 515-$x$, and driver 410-$x$. In at least one embodiment, the clock lane 550 can transmit the clock signal 505. In some embodiments, the clock signal 505 can be serialized at the second clock 509. In an embodiment, the PLL 520 can generate the second clock 509. In at least one embodiment, the PLL 520 can generate the second clock 509 from the first clock 507. For example, the PLL 520 can shift the first clock 507 by 90 degrees to generate the second clock 509. In some embodiments, the PLL 520 can divide down the first clock 507 or the second clock 509. In at least one embodiment, the clock signal 505 is a single-phase forwarded clock signal. In some embodiments, the clock signal 505 is a multi-phase clock signal. That is, as a data rate of the GRS link 115 increases (e.g., data 405 is transferred more quickly), the clock signal 505 can be a multi-phase clock to reduce stress on the GRS link 115.

In an embodiment, the receiver 104 is configured to receive data 405 from each data lane 430 and the clock signal 505 from the clock lane 550. In some embodiments, each data lane 430 can be coupled with a buffer 535, a delay component 525, a sampler 530, and a multiplexer 540 at the receiver 104. In some embodiments, the buffer 535 is configured to receive data 405 and output data 405. For example, the buffer 535 can receive serial data bits 405 and output data 405 when "B" bits are received. In some embodiments, delay components 525 are configured to mitigate delays associated with each data lane 430. That is, due to manufacturing deviations, each data lane 430 can have different transmitting speeds or delays—e.g., data 405 can be received at different times across the data lanes 430 at the receiver 104. To mitigate the varying delays and manufacturing deviations, the delay components 525 can be trained to output data 405 to the samplers 530 at a same time across the data lanes 430. In some embodiments, the receiver 104 can utilize the received clock signal 547 to recover the original transmitter clock—e.g., the receiver 104 can recover the parallel data 405 by recovering the transmitter clock. For example, samplers 530 are configured to sample incoming data 405 at the received clock signal 547 to determine the value of data 405. In some embodiments, the multiplexer 540 can be configured to deserialize data 405—e.g., deserialize 32 bits into two (2) bits. In other examples, multiplexer 540 can deserialize a different amount of data—e.g., 64:4, 16:1, 8:1, etc.

Figure 6:
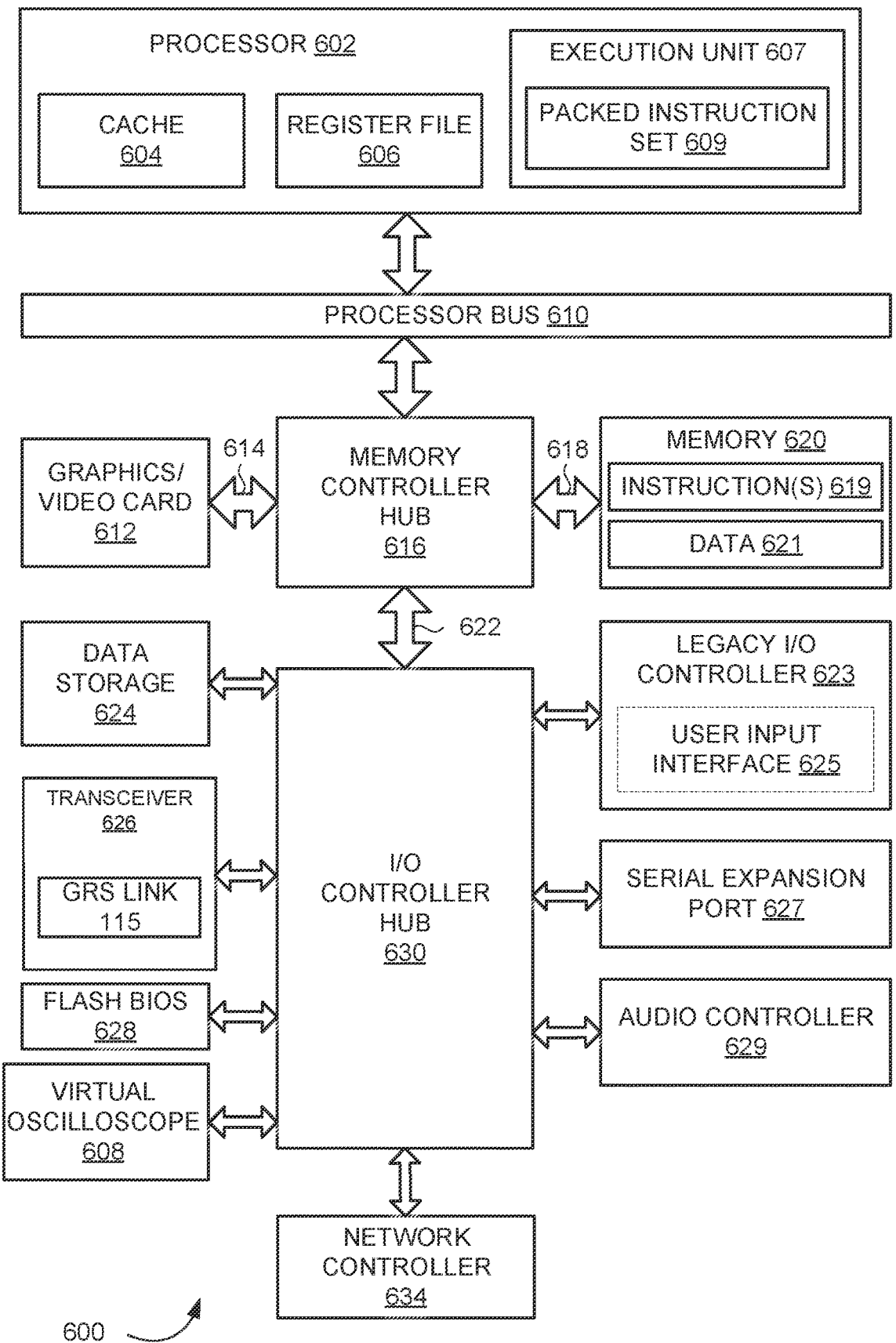
FIG. 6 illustrates an example computer system including a transceiver including a chip-to-chip interconnect, in accordance with at least some embodiments.

FIG. 6 illustrates a computer system 600 including a transceiver with a chip-to-chip interconnect, in accordance with at least one embodiment. In at least one embodiment, computer system 600 may be a system with interconnected devices and components, an SOC, or some combination. In at least one embodiment, computer system 600 is formed with a processor 602 that may include execution units to execute an instruction. In at least one embodiment, computer system 600 may include, without limitation, a component, such as processor 602, to employ execution units including logic to perform algorithms for processing data. In at least one embodiment, computer system 600 may include processors, such as PENTIUM® Processor family, Xeon™, Itanium®, XScale™ and/or StrongARM™, Intel® Core™, or Intel® Nervana™ microprocessors available from Intel Corporation of Santa Clara, California, although other systems (including PCs having other microprocessors, engineering workstations, set-top boxes and like) may also be used. In at least one embodiment, computer system 600 may execute a version of WINDOWS' operating system available from Microsoft Corporation of Redmond, Wash., although other operating systems (UNIX and Linux for example), embedded software, and/or graphical user interfaces, may also be used.

In at least one embodiment, computer system 600 may be used in other devices such as handheld devices and embedded applications. Some examples of handheld devices include cellular phones, Internet Protocol devices, digital cameras, personal digital assistants ("PDAs"), and handheld PCs. In at least one embodiment, embedded applications may include a microcontroller, a digital signal processor (DSP), an SoC, network computers ("NetPCs"), set-top boxes, network hubs, wide area network ("WAN") switches, or any other system that may perform one or more instructions. In an embodiment, computer system 600 may be used in devices such as graphics processing units (GPUs), network adapters, central processing units and network devices such as switch (e.g., a high-speed direct GPU-to-GPU interconnect such as the NVIDIA GH100 NVLINK or the NVIDIA Quantum 2 64 Ports InfiniBand NDR Switch).

In at least one embodiment, computer system 600 may include, without limitation, processor 602 that may include, without limitation, one or more execution units 607 that may be configured to execute a Compute Unified Device Architecture ("CUDA") (CUDA® is developed by NVIDIA Corporation of Santa Clara, CA) program. In at least one embodiment, a CUDA program is at least a portion of a software application written in a CUDA programming language. In at least one embodiment, computer system 600 is a single processor desktop or server system. In at least one embodiment, computer system 600 may be a multiprocessor system. In at least one embodiment, processor 602 may include, without limitation, a CISC microprocessor, a RISC microprocessor, a VLIW microprocessor, a processor implementing a combination of instruction sets, or any other processor device, such as a digital signal processor, for example. In at least one embodiment, processor 602 may be coupled to a processor bus 610 that may transmit data signals between processor 602 and other components in computer system 600.

In at least one embodiment, processor 602 may include, without limitation, a Level 1 ("L1") internal cache memory ("cache") 604. In at least one embodiment, processor 602 may have a single internal cache or multiple levels of internal cache. In at least one embodiment, cache memory may reside external to processor 602. In at least one embodiment, processor 602 may also include a combination of both internal and external caches. In at least one embodiment, a register file 606 may store different types of data in various registers including, without limitation, integer registers, floating point registers, status registers, and instruction pointer register.

In at least one embodiment, execution unit 607, including, without limitation, logic to perform integer and floating point operations, also resides in processor 602. Processor 602 may also include a microcode ("ucode") read only memory ("ROM") that stores microcode for certain macro instructions. In at least one embodiment, processor 602 may include logic to handle a packed instruction set 609. In at least one embodiment, by including packed instruction set 609 in an instruction set of a general-purpose processor 602, along with associated circuitry to execute instructions, operations used by many multimedia applications may be performed using packed data in a general-purpose processor 602. In at least one embodiment, many multimedia applications may be accelerated and executed more efficiently by using full width of a processor's data bus for performing operations on packed data, which may eliminate a need to transfer smaller units of data across a processor's data bus to perform one or more operations one data element at a time.

In at least one embodiment, an execution unit may also be used in microcontrollers, embedded processors, graphics devices, DSPs, and other types of logic circuits. In at least one embodiment, computer system 600 may include, without limitation, a memory 620. In at least one embodiment, memory 620 may be implemented as a DRAM device, an SRAM device, flash memory device, or other memory device. Memory 620 may store instruction(s) 619 and/or data 621 represented by data signals that may be executed by processor 602.

In at least one embodiment, a system logic chip may be coupled to processor bus 610 and memory 620. In at least one embodiment, the system logic chip may include, without limitation, a memory controller hub ("MCH") 616, and processor 602 may communicate with MCH 616 via processor bus 610. In at least one embodiment, MCH 616 may provide a high bandwidth memory path 618 to memory 620 for instruction and data storage and for storage of graphics commands, data and textures. In at least one embodiment, MCH 616 may direct data signals between processor 602, memory 620, and other components in computer system 600 and to bridge data signals between processor bus 610, memory 620, and a system I/O 622. In at least one embodiment, a system logic chip may provide a graphics port for coupling to a graphics controller. In at least one embodiment, MCH 616 may be coupled to memory 620 through high bandwidth memory path 618, and graphics/video card 612 may be coupled to MCH 616 through an Accelerated Graphics Port ("AGP") interconnect 614.

In at least one embodiment, computer system 600 may use system I/O 622 that is a proprietary hub interface bus to couple MCH 616 to I/O controller hub ("ICH") 630. In at least one embodiment, ICH 630 may provide direct connections to some I/O devices via a local I/O bus. In at least one embodiment, a local I/O bus may include, without limitation, a high-speed I/O bus for connecting peripherals to memory 620, a chipset, and processor 602. Examples may include, without limitation, an audio controller 629, a firmware hub ("flash BIOS") 628, a transceiver 626, a data storage 624, a legacy I/O controller 623 containing a user input interface 625 and a keyboard interface, a serial expansion port 627, such as a USB, and a network controller 634. Data storage 624 may comprise a hard disk drive, a floppy disk drive, a CD-ROM device, a flash memory device, or other mass storage device. In an embodiment, the transceiver 626 includes the GRS link 115.

In at least one embodiment, FIG. 6 illustrates a system, which includes interconnected hardware devices or "chips" in the transceiver 626—e.g., the transceiver 626 includes a chip-to-chip interconnect including the first device 110 and second device 112 as described with reference to FIG. 1). In at least one embodiment, FIG. 6 may illustrate an exemplary SoC. In at least one embodiment, devices illustrated in FIG. 6 may be interconnected with proprietary interconnects, standardized interconnects (e.g., PCIe). In at least one embodiment, one or more components of system 600 are interconnected using compute express link ("CXL") interconnects. In an embodiment, the transceiver 626 can utilize a GRS link 115 as described with reference to FIGS. 1-5. In such embodiments, the GRS link 115 can include an "N" number of data lanes associated with a forwarded clock, where "N" is any number greater than one (1). In some embodiments, the GRS link 115 can transmit data in accordance with a memory coherence protocol between the first device 110 and the second device 112. In some embodiments, the GRS link 115 can include hardware to manage the memory coherence protocol for the communication system.

Other variations are within spirit of present disclosure. Thus, while disclosed techniques are susceptible to various modifications and alternative constructions, certain illustrated embodiments thereof are shown in drawings and have been described above in detail. It should be understood, however, that there is no intention to limit the disclosure to a specific form or forms disclosed, but on the contrary, the intention is to cover all modifications, alternative constructions, and equivalents falling within the spirit and scope of the disclosure, as defined in appended claims.

Use of terms "a" and "an" and "the" and similar referents in the context of describing disclosed embodiments (especially in the context of following claims) are to be construed to cover both singular and plural, unless otherwise indicated herein or clearly contradicted by context, and not as a definition of a term. Terms "comprising," "having," "including," and "containing" are to be construed as open-ended terms (meaning "including, but not limited to,") unless otherwise noted. "Connected," when unmodified and referring to physical connections, is to be construed as partly or wholly contained within, attached to, or joined together, even if there is something intervening. Recitations of ranges of values herein are merely intended to serve as a shorthand method of referring individually to each separate value falling within the range, unless otherwise indicated herein, and each separate value is incorporated into the specification as if it were individually recited herein. In at least one embodiment, the use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but subset and corresponding set may be equal.

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., may be either A or B or C, or any nonempty subset of the set of A and B and C. For instance, in an illustrative example of a set having three members, conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, the term "plurality" indicates a state of being plural (e.g., "a plurality of items" indicates multiple items). In at least one embodiment, the number of items in a plurality is at least two, but can be more when so indicated either explicitly or by context. Further, unless stated otherwise or otherwise clear from context, the phrase "based on" means "based at least in part on" and not "based solely on."

Operations of processes described herein can be performed in any suitable order unless otherwise indicated herein or otherwise clearly contradicted by context. In at least one embodiment, a process such as those processes described herein (or variations and/or combinations thereof) is performed under control of one or more computer systems configured with executable instructions and is implemented as code (e.g., executable instructions, one or more computer programs or one or more applications) executing collectively on one or more processors, by hardware or combinations thereof. In at least one embodiment, code is stored on a computer-readable storage medium, for example, in the form of a computer program comprising a plurality of instructions executable by one or more processors. In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (i.e., as a result of being executed) by one or more processors of a computer system, cause a computer system to perform operations described herein. In at least one embodiment, a set of non-transitory computer-readable storage media comprises multiple non-transitory computer-readable storage media and one or more of individual non-transitory storage media of multiple non-transitory computer-readable storage media lack all of the code while multiple non-transitory computer-readable storage media collectively store all of the code. In at least one embodiment, executable instructions are executed such that different instructions are executed by different processors.

Accordingly, in at least one embodiment, computer systems are configured to implement one or more services that singly or collectively perform operations of processes described herein and such computer systems are configured with applicable hardware and/or software that enable the performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

All references, including publications, patent applications, and patents, cited herein are hereby incorporated by reference to the same extent as if each reference were individually and specifically indicated to be incorporated by reference and were set forth in its entirety herein.

In description and claims, terms "coupled" and "connected," along with their derivatives, may be used. It should be understood that these terms may not be intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification terms such as "processing," "computing," "calculating," "determining," or like, refer to action and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

In a similar manner, the term "processor" may refer to any device or portion of a device that processes electronic data from registers and/or memory and transform that electronic data into other electronic data that may be stored in registers and/or memory. A "computing platform" may comprise one or more processors. As used herein, "software" processes may include, for example, software and/or hardware entities that perform work over time, such as tasks, threads, and intelligent agents. Also, each process may refer to multiple processes, for carrying out instructions in sequence or in parallel, continuously or intermittently. In at least one embodiment, terms "system" and "method" are used herein interchangeably insofar as the system may embody one or more methods and methods may be considered a system.

In the present document, references may be made to obtaining, acquiring, receiving, or inputting analog or digital data into a subsystem, computer system, or computer-implemented machine. In at least one embodiment, the process of obtaining, acquiring, receiving, or inputting analog and digital data can be accomplished in a variety of ways such as by receiving data as a parameter of a function call or a call to an application programming interface. In at least one embodiment, processes of obtaining, acquiring, receiving, or inputting analog or digital data can be accomplished by transferring data via a serial or parallel interface. In at least one embodiment, processes of obtaining, acquiring, receiving, or inputting analog or digital data can be accomplished by transferring data via a computer network from providing entity to acquiring entity. In at least one embodiment, references may also be made to providing, outputting, transmitting, sending, or presenting analog or digital data. In various examples, processes of providing, outputting, transmitting, sending, or presenting analog or digital data can be accomplished by transferring data as an input or output parameter of a function call, a parameter of an application programming interface or inter-process communication mechanism.

Although descriptions herein set forth example embodiments of described techniques, other architectures may be used to implement described functionality, and are intended to be within the scope of this disclosure. Furthermore, although specific distributions of responsibilities may be defined above for purposes of description, various functions and responsibilities might be distributed and divided in different ways, depending on circumstances.

Furthermore, although the subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

What is claimed is:

1. A system comprising:
   a first device coupled to a printed circuit board (PCB);
   a second device coupled to the PCB; and
   a link coupled with the first device, the second device, and the PCB, the link comprising a clock lane associated with transmitting a clock signal and one or more data lanes corresponding to the clock lane, and wherein the link is configured to transmit unencoded data using ground referenced signaling (GRS).

2. The system of claim 1, wherein the link is further configured to:
   transmit data from the first device to the second device, wherein the data is transmitted according to a memory coherence protocol associated with transmitting data from the first device to the second device.

3. The system of claim 1, wherein a number of data lanes of the one or more data lanes is a value greater than one, and wherein the value is odd or even.

4. The system of claim 1, wherein:
   the first device is a central processing unit (CPU); and
   the second device is a graphics processing unit (GPU).

5. The system of claim 1, wherein:
   the first device is a central processing unit (CPU) or graphics processing unit (GPU); and
   the second device is a CPU or GPU.

6. The system of claim 1, wherein each data lane of the one or more data lanes of the link is associated with a single trace of the PCB.

7. The system of claim 1, wherein the clock signal is a single-phase clock signal.

8. The system of claim 1, wherein the clock signal is a multi-phase clock signal.

9. A system comprising:
   a first device coupled to a substrate;
   a second device coupled to the substrate; and
   a ground referenced signaling (GRS) link coupled to the first device, the second device, and the substrate, wherein the GRS link is configured to transmit unencoded data using GRS and in accordance with a memory coherence protocol associated with transmitting data between the first device and the second device.

10. The system of claim 9, wherein the link further comprises:
    a first clock lane associated with transmitting a first clock signal from the first device to the second device and a first set of data lanes corresponding to the first clock lane to transmit first unencoded data from the first device to the second device; and
    a second clock lane associated with transmitting a second clock signal from the second device to the first device and a second set of data lanes corresponding to the second clock lane to transmit second unencoded data from the second device to the first device.

11. The system of claim 10, wherein a first number of data lanes in the first set of data lanes is the same as a second number of data lanes in the second set of data lanes, and wherein both the first number and second number are odd or even.

12. The system of claim 10, wherein each data lane of the first set of data lanes is coupled to a bump of a bump pattern coupling the GRS link to the substrate.

13. The system of claim 9, wherein the GRS link is configured to:
    transmit a first logic state at a first voltage; and
    transmit a second logic state at a second voltage, wherein the first voltage is positive and the second voltage is negative.

14. The system of claim 13, wherein:
    the first logic state is transmitted at a first current; and
    the second logic state is transmitted at a second current, the first current the same as the second current.

15. The system of claim 9, wherein the GRS link is configured to refrain from encoding the unencoded data transmitted between the first device and the second device.

16. The system of claim 9, wherein:
    the first device is a central processing unit (CPU) or a graphics processing unit (GPU); and
    the second device is a CPU or GPU.

17. A device, comprising:
    a central processing unit (CPU) or graphics processing unit (GPU) configured to process data, wherein the CPU or GPU is coupled to a printed circuit board (PCB) and a ground referenced signaling (GRS) link, the GRS link comprising:
    a first clock lane to transmit a clock signal and one or more data lanes, corresponding to the first clock lane, to transmit first unencoded data using GRS, wherein a number of the one or more data lanes has a value that is odd or even; and
    a second clock lane to receive a clock signal and one or more data lanes, corresponding to the second clock lane, to receive second unencoded data using GRS.

18. The device of claim 17, wherein the GRS link is to further:
    transmit the first unencoded data according to a memory coherence protocol.

19. The device of claim 17, wherein each data lane of the one or more data lanes corresponding to the first clock lane and each data lane of the one or more data lanes corresponding to the second clock lane is associated with a single trace of the PCB.

20. The device of claim 17, wherein the first clock lane is configured to transmit a single-phase clock signal.

* * * * *